United States Patent [19]
Kamiya

[11] Patent Number: 6,014,303
[45] Date of Patent: Jan. 11, 2000

[54] OVERCURRENT PREVENTING DEVICE

[75] Inventor: Hiroshi Kamiya, Tokyo, Japan

[73] Assignee: NEC Corporation, Tokyo, Japan

[21] Appl. No.: 09/179,431

[22] Filed: Oct. 27, 1998

[30] Foreign Application Priority Data

Oct. 28, 1997 [JP] Japan .................................. 9-295396

[51] Int. Cl.[7] .................................................. H02H 3/00
[52] U.S. Cl. .............................. 361/101; 361/86; 361/87; 361/79
[58] Field of Search .................. 361/86, 56, 91, 361/111, 87, 79, 93, 100, 101

[56] References Cited

U.S. PATENT DOCUMENTS 4,926,288  5/1990  Bradley ................................... 361/101

FOREIGN PATENT DOCUMENTS

| 57-176437 | 10/1982 | Japan . |
| 57-203122 | 12/1982 | Japan . |
| 58-78221 | 5/1983 | Japan . |
| 58-142418 | 8/1983 | Japan . |
| 58-182737 | 10/1983 | Japan . |
| 1-163812 | 6/1989 | Japan . |
| 1-304518 | 12/1989 | Japan . |
| 4-618 | 1/1992 | Japan . |
| 6-35582 | 2/1994 | Japan . |
| 7-334281 | 12/1995 | Japan . |

*Primary Examiner*—Michael J. Sherry
*Attorney, Agent, or Firm*—Sughrue, Mion, Zinn Macpeak & Seas, PLLC

[57] ABSTRACT

An overcurrent prevention circuit which removes noise upon transmission of a signal over a signal line between two devices for which different power supplies are used and prevents overcurrent from flowing through the signal line to prevent an otherwise possible breakdown of the devices or an associated element. Current from a waveform outputting terminal to an external signal line is detected from a voltage drop across a resistance part. Then, in response to a result of the detection, an N-channel D-type MOS transistor which supplies current of an output signal to the waveform outputting terminal is controlled between on and off to interrupt supply of power. Consequently, no overcurrent flows out from the waveform outputting terminal, and a clamp diode for removing noise connected to the waveform outputting terminal does not suffer from a breakdown by overcurrent.

6 Claims, 3 Drawing Sheets

OVERCURRENT PREVENTING DEVICE

BACKGROUND OF THE INVENTION

1. Field of the Invention

This invention relates to an overcurrent prevention circuit, and more particularly to a circuit which prevents overcurrent through a signal line between two devices which operate with power supplies which supply power supply voltages different from each other.

2. Description of the Related Art

In a system which includes two devices between which a signal is communicated, it is desirable to provide an element for removing noise such as a clamp diode on the power supply side of an input terminal of a receiving end side of one of the devices. Conventionally, however, where the system described above is of the type wherein different power supplies are used for the two devices, such a noise removing element as described above is not provided because, if the noise removing element is provided, then overcurrent is likely to flow therethrough and between the two devices and cause a breakdown of the devices and the noise removing element.

FIG. 4 shows a transmission-reception system including a transmission device and a reception device which operate with different power supplies. Referring to FIG. 4, in the transmission-reception system shown, a transmission device 41 operates with a power supply VCC1 while a reception device 42 operates with a power supply VCC2 different from the power supply VCC1. The transmission device 41 and the reception device 42 are connected to each other by a signal line. In this instance, if it is assumed that a clamp diode 40 is inserted in the signal line as seen in FIG. 4, then when the power supply VCC1 is in an on-state and the power supply VCC2 is in an off-state, overcurrent flows through the clamp diode 40. Therefore, in the conventional transmission-reception system, actually the clamp diode 40 is not inserted.

The transmission-reception system described above is disadvantageous in that it cannot remove noise because a clamp diode which serves as a noise removing element is not inserted in the signal line between the transmission device and the reception device. Meanwhile, an apparatus for preventing production of noise in a bus is disclosed in Japanese Patent Laid-Open Application No. Heisei 1-163812. However, the document just mentioned is silent on the prevention of a breakdown of a noise removing element and therefore cannot solve the disadvantage of the conventional transmission-reception system described above.

SUMMARY OF THE INVENTION

It is an object of the present invention to provide an overcurrent prevention circuit which can remove noise upon transmission of a signal over a signal line between two devices for which different power supplies are used, and prevent overcurrent from flowing through the signal line to prevent an otherwise possible breakdown of the devices or an associated element.

In order to attain the object described above, according to an aspect of the present invention, there is provided an overcurrent prevention circuit for a system which includes a first device which operates with a first power supply which supplies a first power supply voltage, and a second device which operates with a second power supply which supplies a second power supply voltage lower than the first power supply voltage. The overcurrent prevent circuit comprises a noise removing element interposed between a signal line, between the first and second devices, and the second power supply, and a current control means for interrupting the supply of the power supply voltage to the first device by the first power supply when an amount of current which flows through the signal line exceeds a value determined in advance.

According to another aspect of the present invention, there is provided an overcurrent prevention circuit for a system which includes a first device which operates with a first power supply which supplies a first power supply voltage, and a second device which operates with a second power supply which supplies a second power supply voltage lower than the first power supply voltage. The overcurrent prevent circuit comprises a noise removing element interposed between a signal line, between the first and second devices, and the second power supply, and a current control means for electrically disconnecting the signal line between the first and second devices when an amount of current flowing through the signal line exceeds a value determined in advance.

In both of the overcurrent prevention circuits, current flowing through the signal line between the two devices is detected, and supply of power to the signal line is controlled between on and off in response to a result of the detection. Consequently, overcurrent does not flow to the noise removing element interposed between the signal line and the second power supply, thereby preventing the noise removing element from being broken down by otherwise possible overcurrent.

The present invention can be embodied in the following forms:

(1) The noise removing element is a clamp diode interposed between the signal line and the first power supply.

(2) The voltage drop detection means includes a resistor for detecting the drop of the first power supply voltage supplied to an outputting circuit which sends out a signal to the signal line, and a diode connected in parallel to the resistor that controls the switching means, which is composed of a transistor, that switches between on and off in response to a difference between the drop of the first power supply voltage detected by the resistor and a voltage drop by the diode.

The above and other objects, features and advantages of the present invention will become apparent from the following description and the appended claims, taken in conjunction with the accompanying drawings in which like parts or elements are denoted by like reference symbols.

BRIEF DESCRIPTION OF THE INVENTION

DESCRIPTION OF THE PREFERRED EMBODIMENTS

Figure 1:
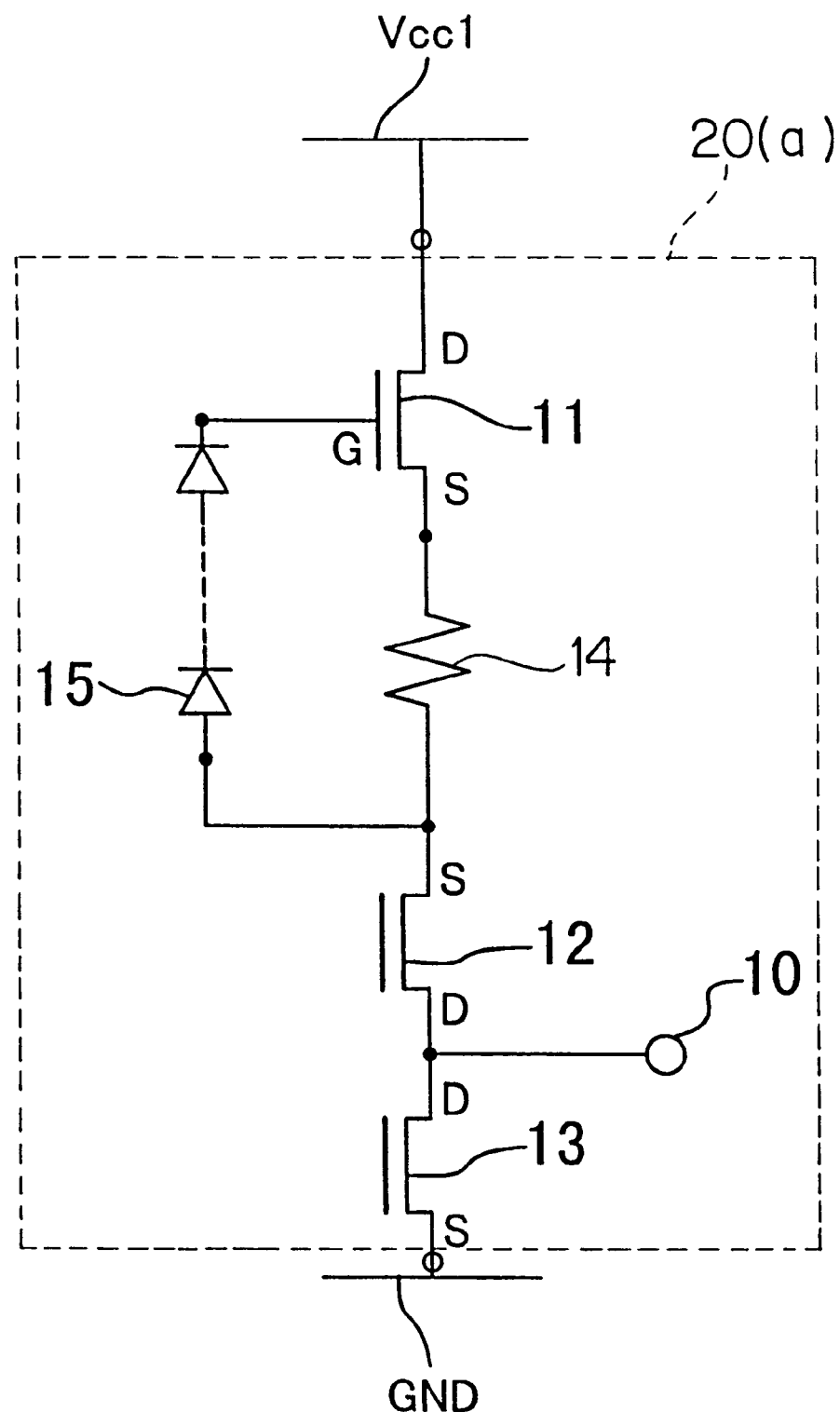
FIG. 1 is a block diagram of an overcurrent prevention circuit to which the present invention is applied.

Referring first to FIG. 1, there is shown an overcurrent prevention circuit 20(a) to which the present invention is applied. A power supply Vcc1 is connected to the drain electrode D of an N-channel D-type MOS transistor (Tr) 11, whose source electrode S is connected to one of a pair of terminals of a voltage drop detecting resistance part 14. The other terminal of the voltage drop detecting resistance part 14 is connected to the anode of a diode set 15 composed of a plurality of diodes connected in series and also to the source electrode S of a PMOS transistor 12. The cathode of the diode set 15 is connected to the gate electrode G of the N-channel D-type MOS transistor 11, and the drain electrode D of the PMOS transistor 12 is connected to the drain electrode D of an NMOS transistor 13 and a waveform outputting terminal 10. The source electrode S of the NMOS transistor 13 is connected to the ground GND.

Figure 2:
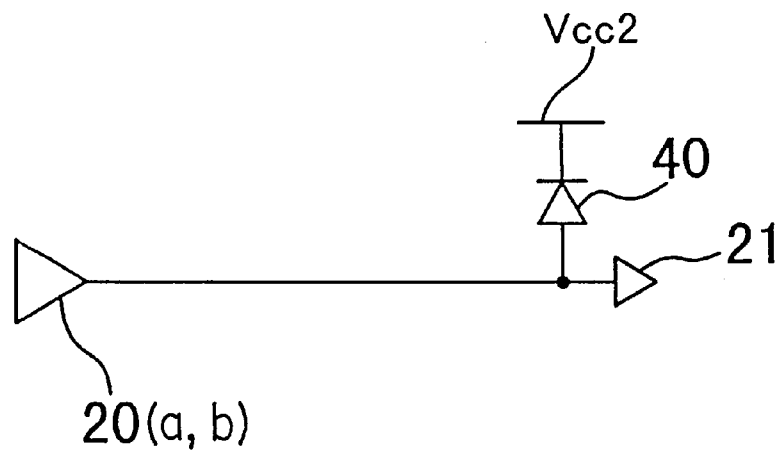
FIG. 2 is a block diagram showing an exemplary application of the overcurrent prevention circuit of FIG. 1.

Referring now to FIG. 2, there is shown one of the exemplary applications of the overcurrent prevention circuit described above. The overcurrent prevention circuit, which is generally denoted at 20 in FIG. 2, is connected to a different power supply employing device 21 via the waveform outputting terminal (10, FIG. 1), which employs a different power supply Vcc2, and a clamp diode 40 for removing noise is provided at an input terminal of the different power supply employing device 21 adjacent the power supply Vcc2.

Referring also to FIG. 1, a situation wherein the NMOS transistor 13 of the overcurrent prevention circuit 20 is OFF while the PMOS transistor is ON and the waveform outputting terminal 10 is in a HIGH output state is considered. In this situation, to the source electrode S of the PMOS transistor 12, current is supplied from the power supply Vcc1 through the N-channel D-type MOS transistor 11.

Here, if it is assumed that the power supply potential of the different power supply employing device 21 is lower than the power supply potential of the overcurrent prevention circuit 20, then a large amount of current flows from the waveform outputting terminal. If a large amount of current flows, then a potential difference appears between the opposite terminals of the voltage drop detecting resistance part 14 and a voltage drop occurs across the voltage drop detecting resistance part 14. A potential difference created by a difference between this voltage drop and another voltage drop across the diode set 15 is applied to the gate electrode G of the N-channel D-type MOS transistor 11. Then, if the potential difference reaches a certain potential difference, the operation of the N-channel D-type MOS transistor 11 turned OFF. Consequently, no overcurrent flows, and it does not occur that the clamp diode 40 (FIG. 2) is broken by overcurrent.

Figure 3:
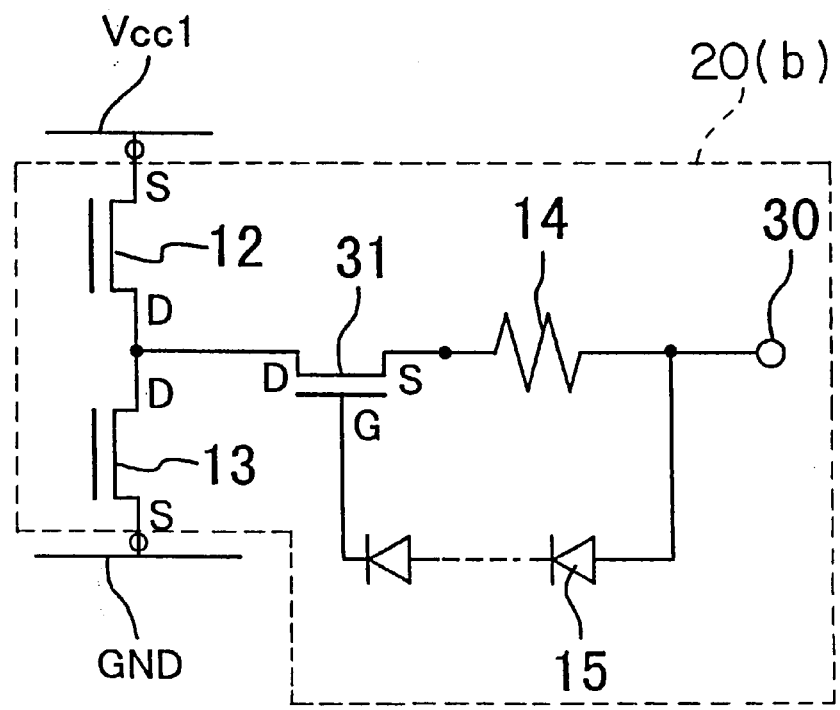
FIG. 3 is a block diagram of another overcurrent prevention circuit to which the present invention is applied.
Figure 4:
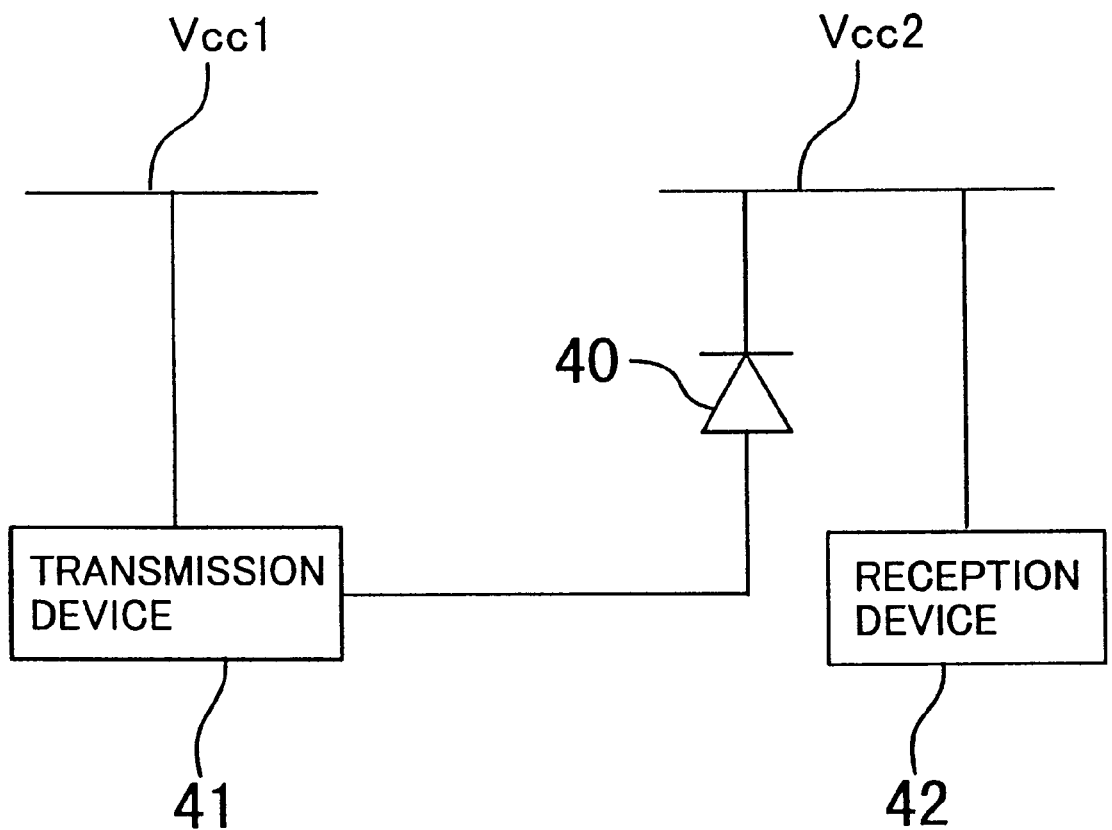
FIG. 4 is a block diagram showing a general construction of a transmission-reception system including a transmission device and a reception device which operate with different power supplies.

FIG. 3 shows another overcurrent prevention circuit 20(b) to which the present invention is applied. Referring to FIG. 3, a power supply Vcc1 is connected to the source electrode S of a PMOS transistor 12, and the drain electrode D of the PMOS transistor 12 is connected to the drain electrode D of an N-channel D-type MOS transistor 31 and the drain electrode D of an NMOS transistor 13. The source electrode S of the N-channel D-type MOS transistor 31 is connected to one of a pair of terminals of a voltage drop detecting resistance part 14, and the other terminal of the voltage drop detecting resistance part 14 is connected to the anode of a diode set 15 composed of a plurality of diodes connected in series and a waveform outputting terminal 30. The cathode of the diode set 15 is connected to the gate electrode G of the N-channel D-type MOS transistor 31, and the source electrode S of the NMOS transistor 13 is connected to the ground GND.

Also the overcurrent detection circuit described above with reference to FIG. 2 can be applied in such a circuit as described hereinabove with reference to FIG. 2. Again, referring back to FIG. 2, a different power supply employing device 21 which operates with a power supply Vcc2 is connected to the output terminal (30 FIG. 3) of the overcurrent prevention circuit, which also is generally denoted at 20, and a clamp diode 40 for removing noise is provided at an input terminal of the different power supply employing device 21 adjacent the power supply Vcc2.

Referring also FIG. 3, a situation wherein the NMOS transistor 13 of the overcurrent prevention circuit 20 is OFF while the PMOS transistor 12 is ON and the waveform outputting terminal 30 is in a HIGH output state is considered. In this situation, to the waveform outputting portion 30, current is supplied from the power supply Vcc1 through the PMOS transistor 12 and the N-channel D-type MOS transistor 31.

Here, if it is assumed that the power supply potential of the different power supply employing device 21 is lower than the power supply potential of the overcurrent prevention circuit 20, then a large amount of current flows from the waveform outputting terminal 30. If a large amount of current flows, then a potential difference appears between the opposite terminals of the voltage drop detecting resistance part 14 and a voltage drop occurs across the voltage drop detecting resistance part 14. A potential difference created by a difference between this voltage drop and a voltage drop across the diode set 15 is applied to the gate electrode G of the N-channel D-type MOS transistor 31. Then, if the potential difference reaches a certain potential difference, the operation of the N-channel D-type MOS transistor 31 is turned OFF. Consequently, no overcurrent flows, and it does not occur that the clamp diode 40 is broken by overcurrent.

It is to be noted that, by adjusting, in FIGS. 1 and 3, the resistance value of the voltage drop detecting resistance part 14 and the number of diodes connected in the diode set 15 provided in parallel to the resistance part 14, the voltage value at which the N-channel D-type MOS transistor 11 or 31 is turned on or off can be adjusted. The resistance value and the number of connected diodes should be determined taking the potential difference between the power supplies Vcc1 and the Vcc2, the withstanding voltage of the clamp diode and so forth into consideration.

Further, while the foregoing description relates to a case wherein the transmission side device has a higher power supply voltage than the reception side device, it is clear that, also where conversely the transmission side device has a higher power supply voltage than the reception side device, a breakdown of a noise removing element such as a clamp diode connected can be prevented similarly.

In summary, according to the present circuit, since current to a signal line is detected and supply of power is interrupted in response to a result of the detection, even if a clamp diode for removing noise is added to the power supply side of a different power supply employing device, a breakdown of the device by overcurrent can be prevented. It is clear that not only a clamp diode but a noise removing element interposed between the signal line between the two devices and a power supply are prevented from being broken by overcurrent.

While preferred embodiments of the present invention have been described using specific terms, such description is for illustrative purposes only, and it is to be understood that changes and variations may be made without departing from the spirit or scope of the following claims.

What is claimed is:

1. An overcurrent prevention circuit for a system which includes a first device which operates with a first power supply which supplies a first power supply voltage, and a second device which operates with a second power supply which supplies a second power supply voltage lower than the first power supply voltage, comprising:

a noise removing element interposed between a signal line between said first and second devices and said second power supply; and current control means for interrupting the supply of the power supply voltage to said first device by said first power supply when an amount of current which flows through said signal line exceeds a value determined in advance.

2. An overcurrent prevention circuit as claimed in claim 1, wherein said current control means includes voltage drop detection means for detecting a drop of the first power supply voltage supplied to an outputting circuit which sends out a signal to said signal line, and switching means for interrupting the supply of the first power supply voltage to said outputting circuit when the detected drop of the first power supply voltage exceeds a value determined in advance.

3. An overcurrent prevention circuit as claimed in claim 2, wherein said switching means is a transistor which is switched on and off in response to a result of the detection of said voltage drop detection means.

4. An overcurrent prevention circuit for a system which includes a first device which operates with a first power supply which supplies a first power supply voltage, and a second device which operates with a second power supply which supplies a second power supply voltage lower than the first power supply voltage, comprising:

a noise removing element interposed between a signal line between said first and second devices and said second power supply; and current control means for electrically disconnecting said signal line between said first and second devices when an amount of current flowing through said signal line exceeds a value determined in advance.

5. An overcurrent prevention circuit as claimed in claim 4, wherein said current control means includes voltage drop detection means for detecting a drop of an output voltage of an outputting circuit which sends out a signal to said signal line, and switching means for interrupting the sending out of the signal from said outputting circuit to said signal line when the detected drop of the output voltage of said outputting circuit exceeds a value determined in advance.

6. An overcurrent prevention circuit as claimed in claim 5, wherein said switching means is a transistor which is turned on and off in response to a result of the detection of said voltage drop detection means.

* * * * *